(12) United States Patent
Jensen

(10) Patent No.: US 10,736,239 B2
(45) Date of Patent: Aug. 4, 2020

(54) HIGH PERFORMANCE COMPUTING RACK AND STORAGE SYSTEM WITH FORCED COOLING

(71) Applicant: Z-IMPACT, INC., Cheyenne, WY (US)

(72) Inventor: John Robert Jensen, Cheyenne, WY (US)

( * ) Notice: Subject to any disclaimer, the term of this patent is extended or adjusted under 35 U.S.C. 154(b) by 0 days.

(21) Appl. No.: 15/273,506

(22) Filed: Sep. 22, 2016

(65) Prior Publication Data

US 2017/0135249 A1    May 11, 2017

Related U.S. Application Data

(60) Provisional application No. 62/222,069, filed on Sep. 22, 2015.

(51) Int. Cl.
*H05K 7/20* (2006.01)
*H05K 7/14* (2006.01)

(52) U.S. Cl.
CPC ....... *H05K 7/20736* (2013.01); *H05K 7/1488* (2013.01)

(58) Field of Classification Search
CPC .... G06F 3/0679; G06F 1/20; G06F 2200/201; H05K 7/1488; H05K 7/20736; H05K 7/1489; H05K 7/1487; H05K 7/1497; H05K 7/20781; H05K 7/20836; H05K 7/20727; H05K 7/20827; H05K 7/20172; H05K 7/20909; H04Q 1/035
See application file for complete search history.

(56) References Cited

U.S. PATENT DOCUMENTS

| | | | |
|---|---|---|---|
| 5,710,402 A * | 1/1998 | Karnbach | H02B 1/565 218/157 |
| 7,352,576 B2 | 4/2008 | McClure | 361/695 |
| 7,653,499 B2 | 1/2010 | Corrado et al. | 702/61 |
| 7,766,692 B2 | 8/2010 | Johnsen et al. | 439/488 |
| 7,850,260 B2 | 12/2010 | Figueroa et al. | 312/223.2 |
| 7,907,624 B2 | 3/2011 | Manula et al. | 370/412 |
| 7,957,132 B2 | 6/2011 | Fried | 361/679.47 |
| 8,015,458 B2 | 9/2011 | Johnsen et al. | 714/716 |
| 8,068,351 B2 | 11/2011 | Figueroa et al. | 361/826 |
| 8,116,332 B2 | 2/2012 | Rygh et al. | 370/413 |
| 8,159,973 B2 | 4/2012 | Deng et al. | 370/254 |
| 8,171,325 B2 | 5/2012 | Brillhart et al. | 713/324 |
| 8,259,450 B2 | 9/2012 | Dunwoody et al. | 361/699 |
| 8,410,364 B2 | 4/2013 | Dunwoody et al. | 174/68.1 |
| 8,411,440 B2 | 4/2013 | Dunwoody et al. | 361/699 |
| 8,422,218 B2 | 4/2013 | Fried et al. | 361/679.47 |
| 8,441,792 B2 | 5/2013 | Dunwoody et al. | 361/699 |
| 8,441,793 B2 | 5/2013 | Dunwoody et al. | 361/699 |
| 8,516,089 B2 | 8/2013 | Johnsen et al. | 709/221 |

(Continued)

*Primary Examiner* — James Wu
(74) *Attorney, Agent, or Firm* — Hayes Soloway P.C.

(57) ABSTRACT

A high performance computing (HPC) and storage hyper-converged design with high core densities coupled to a board integrated Non Volatile Memory (NVM) storage ecosystem, has a novel racking and highly efficient cooling system which eliminates the hot/cold aisles normally found in a Data Center. This design enables a dramatic increase in compute cores, Random Access Memory and NVM densities directly on the board, enabling quicker processing and more efficient throughput individually or working in parallel with other compute/storage boards.

26 Claims, 8 Drawing Sheets

(56) References Cited

U.S. PATENT DOCUMENTS

| | | | | |
|---|---|---|---|---|
| 8,601,211 | B2 | 12/2013 | Flynn et al. | 711/114 |
| 8,638,553 | B1 * | 1/2014 | Czamara | H05K 7/20736 |
| | | | | 361/679.48 |
| 8,724,322 | B2 | 5/2014 | Rinke | 361/699 |
| 8,754,546 | B2 | 6/2014 | Arimilli et al. | 307/82 |
| 8,780,552 | B2 | 7/2014 | El-Essawy et al. | 361/679.53 |
| 8,842,421 | B2 * | 9/2014 | Gingrich | H01H 33/53 |
| | | | | 174/17 VA |
| 8,842,688 | B2 | 9/2014 | Vahdat et al. | 370/419 |
| 8,907,520 | B2 | 12/2014 | Chapel et al. | 307/23 |
| 9,025,595 | B2 | 5/2015 | Rossi et al. | G06F 9/54 |
| 9,066,452 | B2 | 6/2015 | Julien-Roux et al. | |
| | | | | H05K 7/208 |
| 9,113,580 | B2 | 8/2015 | Dunwoody et al. | H05K 7/20 |
| 9,144,172 | B2 | 9/2015 | Bergthold et al. | H05K 7/1457 |
| 9,144,176 | B2 | 9/2015 | Bailey et al. | H05K 7/18 |
| 9,144,179 | B2 | 9/2015 | Shelnutt et al. | H05K 7/203 |
| 9,144,181 | B2 | 9/2015 | Wiley | H05K 7/20745 |
| 9,255,417 | B2 * | 2/2016 | Bernard | E04H 1/005 |
| 9,609,769 | B2 * | 3/2017 | Kingston | H05K 5/0213 |
| 2002/0055329 | A1 * | 5/2002 | Storck, Jr. | F24F 7/06 |
| | | | | 454/186 |
| 2009/0147459 | A1 * | 6/2009 | Nguyen | G06F 1/188 |
| | | | | 361/679.31 |
| 2010/0091458 | A1 * | 4/2010 | Mosier, Jr. | H05K 7/20572 |
| | | | | 361/695 |
| 2013/0143478 | A1 * | 6/2013 | Arcos | H02B 13/025 |
| | | | | 454/184 |
| 2014/0124168 | A1 | 5/2014 | Dean et al. | 165/67 |
| 2014/0126143 | A1 | 5/2014 | Dean et al. | 361/679.47 |

\* cited by examiner

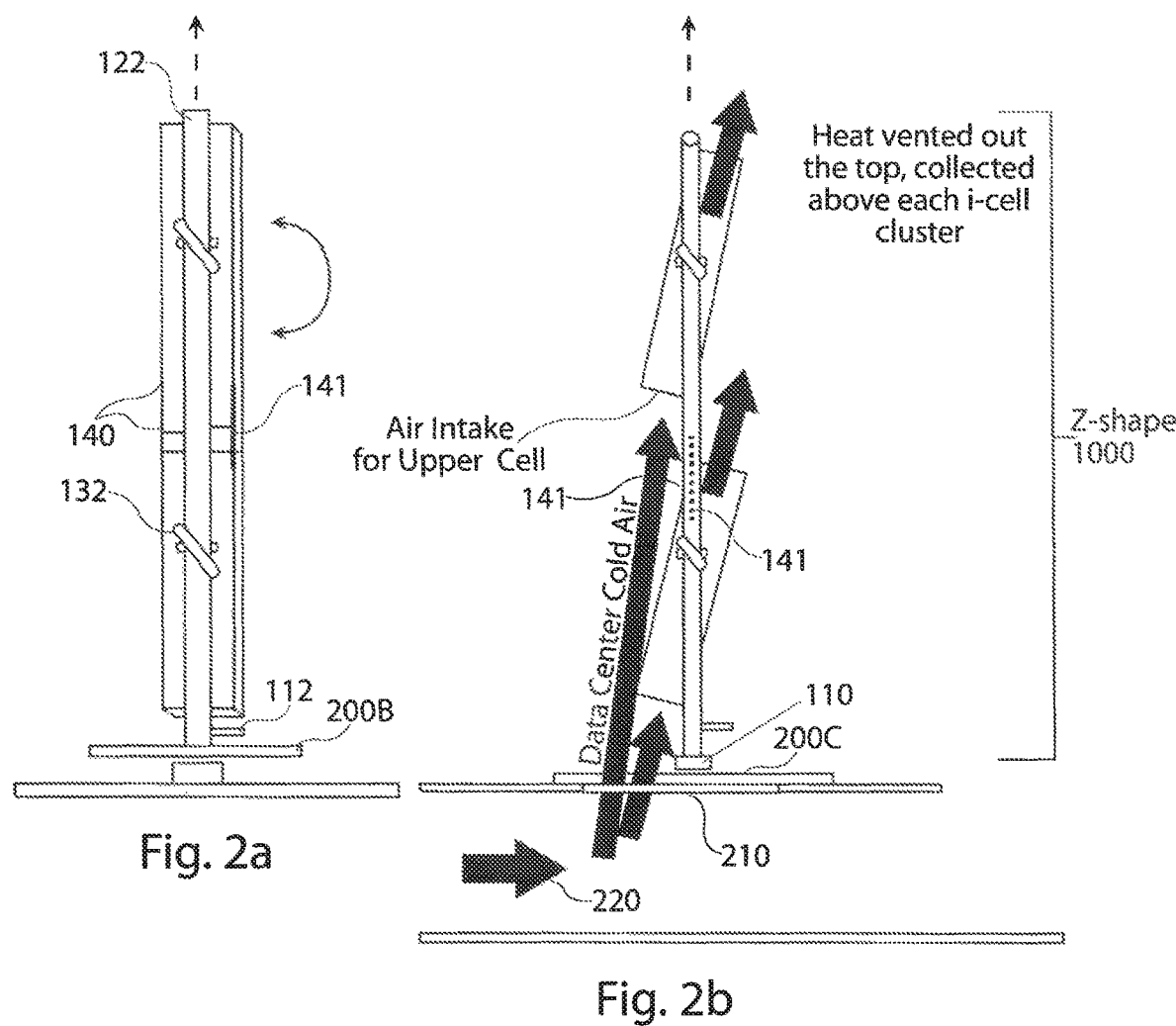

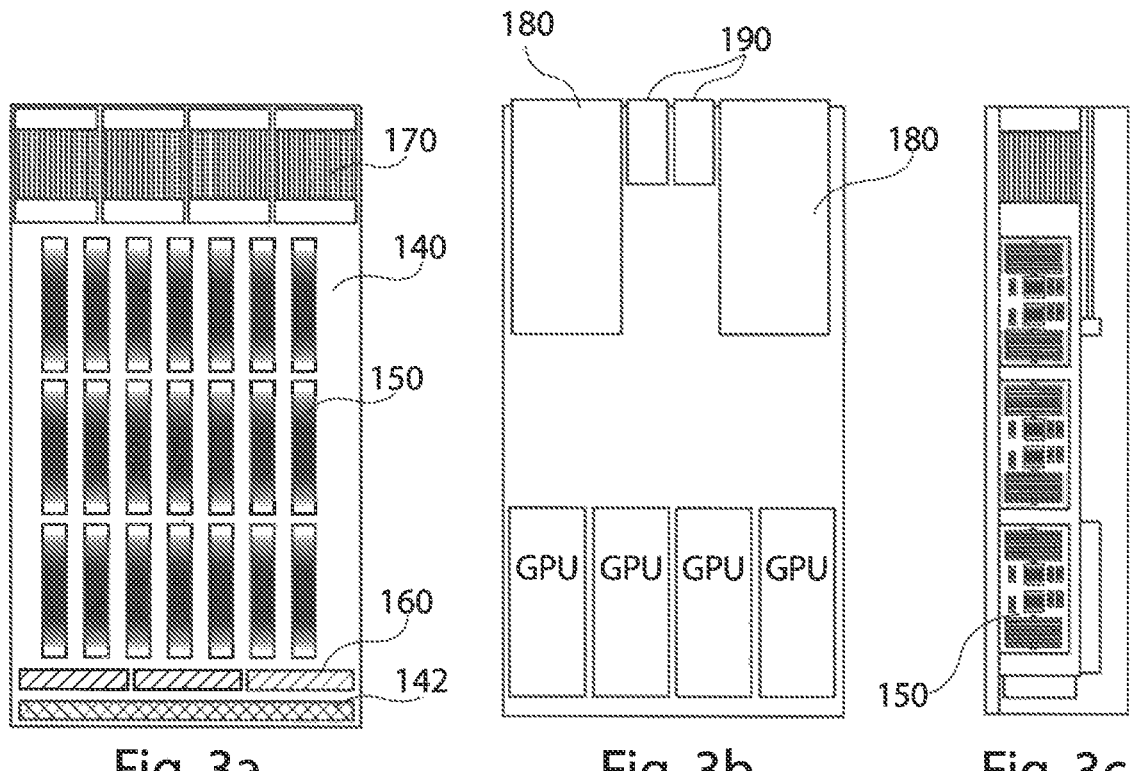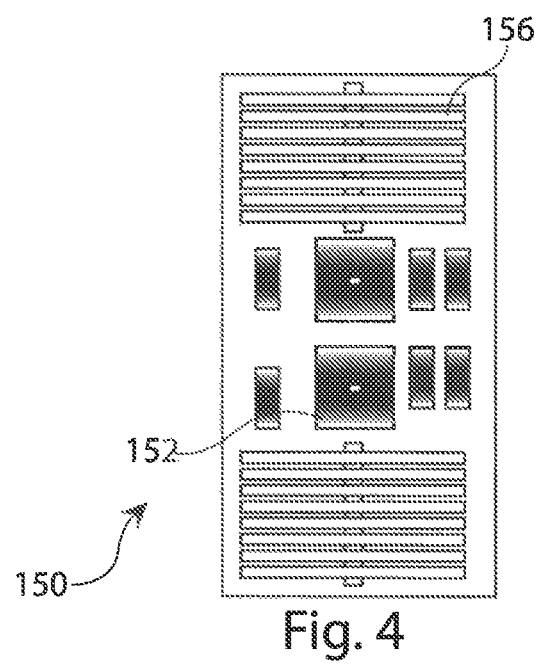

HIGH PERFORMANCE COMPUTING RACK AND STORAGE SYSTEM WITH FORCED COOLING

CROSS REFERENCE TO RELATED APPLICATION

This application claims priority from U.S. Provisional Application Ser. No. 62/222,069, filed Sep. 22, 2015, the contents of which are incorporated herein by reference.

BACKGROUND OF INVENTION

1. Field of the Invention

The invention generally relates to a high performance computing (HPC) and storage hyperconverged design with high core densities coupled to a board integrated Non Volatile Memory (NVM) storage ecosystem, made possible via a novel racking and highly efficient cooling system which eliminates the hot/cold aisles normally found in a Data Center. This design enables a dramatic increase in compute cores, Random Access Memory and NVM densities directly on the board, enabling quicker processing and more efficient throughput individually or working in parallel with other compute/storage boards.

2. Background of the Invention

High performance computers, sometimes also referred as supercomputers, play an important role in the field of computational science, and are used for a wide range of computationally intensive high performance computing (HPC) in various fields, including quantum mechanics, weather forecasting, climate research, oil and gas exploration, molecular modeling, Internet of Things (IoT), data streaming and assembly into big data, big data analytics, physical simulations, and many industry specific compute intensive operations normally require supercomputers.

A typical HPC server may comprise of a plurality of racks/cabinets, with the industry standard 'U" rack design, compute boards and nodes are inter-connected via Ethernet or InfiniBand interconnect protocols, high-speed storage and network interfaces. Each HPC rack comprises of multiple compute processors units (CPUs) times the number of cores contained on a CPU chip, Random Access Memory (RAM) elements and/or integrated storage units. HPC storage systems' demand requires superior input/output (I/O) performance for processing massive amounts of data which has driven ever increasing core, RAM and NVM densities per node, also compacting nodes closer together. All of these tighter integrations are desirable to reduce latency (therefore efficiency) and increase performance under all operating conditions. This typical design approach creates functional limits tied to heat management, reliability and serviceability: these factors must be carefully balanced in any supercomputer/HPC design. As modern supercomputers continue to increase node densities as a means to increase performance, power requirements also rise within an ever tighter space within the HPC chassis; the large amount of heat generated in air cooled systems creates undesired hot spots reducing the lifetime of the system's sub-components. In the HPC industry, the increasing Mean-Time-Between-Failure (MBTF) has driven the hot-pluggable replacement market to escalate the cost of services tied to sub-component warranty replacements. To mitigate heat related failures, diverse approaches have been implemented for HPC rack cooling, ranging from liquid immersion of board components by pumping coolant through the HPC system to a hybrid liquid-air cooling system or air cooling with optimal humidity controlled air conditioning temperatures.

For example, U.S. Patent Application Publication No. 2014/0124168 discloses a cooling system for a high performance compute system. The cooling system includes a closed-loop cooling cell having two compute racks and a cooling tower between the compute racks. U.S. Pat. No. 9,066,452 discloses a cooling device of a computer rack equipped with a back panel including an evacuation zone, toward the exterior of the rack. The cooling device also includes a supporting frame on which a rear door is mounted, molded to surround the air evacuation zone of the computer rack. U.S. Patent Application Publication No. 2014/0126143 discloses a removable computer rack power distribution system for High-Density Clustered Computer Systems. The system includes one or more cooling plates, with each cooling plate disposed between the two computing boards, and a fluid connection coupled to the cooling plate and in fluid communication with the fluid cooling manifold. U.S. Pat. No. 8,780,552 discloses a liquid cooling system for stackable modules in a HPC system. The module is either a liquid-tight module filled with a non-conductive liquid coolant or a module cooled with a liquid coolant circulating through cool plates mounted on electronic components. The liquid coolant is circulated in a closed loop by a pump through heat exchangers, which are coupled to an exterior portion of the surface of the computing system.

However, none of the above disclosures provide a comprehensive solution with a balanced integration of high cooling efficiency, stacking, robust serviceability, easy upgradability, elimination of hot/cold aisles, along with a substantive reduction of supporting Data Center equipment such as what is typically needed for switching, primary and secondary power sources (generators), tertiary power (batteries) all leading to the reclamation of Data Center space, energy and real estate that would otherwise be needed to accommodate Data Center expansions/growing power requirements. Accordingly, a need still exists for a HPC rack and cooling system with acceptable mean time between failure (MTBF) rates, reduced power and cooling requirements as well as performance/efficiency increases from increased density. It would be desirable to have a HPC racking system that drives very high throughput, lower power requirements and very low latency across key technologies, creating increases in core density, Random Access Memory (RAM), and Non-Volatile Memory (NVM) concentration in addition to InfiniBand/remote direct memory access (RDMA) networking communications coupled with highly efficient cooling and energy efficient design which provides ease of serviceability, and, therefore reduces Data Center requirements such as power, space while reaching new levels of throughput/performance efficiencies.

SUMMARY OF THE INVENTION

Embodiments of the invention relate to High Performance Computing (HPC) with high core/RAM density as well as low power, high speed Non Volatile Memory (NVM) storage, all integrated on computer/storage cards or "Raptor 'Vx' cards" which, in plurality are interconnected via a shared InfiniBand backplane and to GPUs, with high cooling efficiency within a self-contained chassis as shown in FIG. 3(a, b) and FIG. 5. Each integrated HPC/storage and storage cell/chassis enclosure or "iCell(s)", which can be either individually or in plurality pivotally mounted onto an open "Z"-shaped rack, hereafter referred to as an Open ZRack FIG. 2(b) or Double Open ZRack FIG. 2(c). The Open ZRack is named as such because it is open, not contained in a cooling enclosure and because an observer whom looks at the Open ZRack from the side can see a 'Z' profile shape 1000 (FIG. 2b) is formed when the iCell is pivoted into its operating angle. The Open Double ZRack may be referred as an Open ZRack and is the hosting mechanism for the iCell which in turn hosts the Raptor 'Vx' Cards FIG. 4, as shown in FIG. 1(a). An Open ZRack/Double Open ZRack is a pivotable frame designed to host a plurality of iCells, FIG. 1(a, b) 140 which in turn draws cool air from the pressurized Data Center floor with or without formed channels to guide the air to cool internal components with the heated exhaust gasses exiting the iCell in an upward vector FIG. 2(b) into the Data Center's catch fans built into the ceilings. This design eliminates the need for both hot/cool air isles and recaptures large amounts of Data Center space, as shown in FIG. 6, while dramatically reducing cold/hot air cross-contamination in the Data Center FIG. 2(c) significantly reducing the need for Heating Ventilating and Air Conditioning (HVAC) supporting equipment thereby lowering power requirements as a result. Attached to the Open ZRack/Double Open ZRack, each iCell is easily serviceable via the cam actuated mechanism on the Open ZRack, allowing the service technician/support engineer to easily tilt and lock the iCell(s) at various service angles for easy access to all hot-swappable items such as: the electrostatic filters, Raptor 'Vx' cards, power supplies, fans, switches or GPUs. Additionally, the ability to rotate the iCell(s) via the Open ZRack manual or automatic cam mechanism providing ease of service for powered-off maintenance such as for cleaning internal components, filters or replacing the backplane which slides out via a rail system. Reference to the Open ZRack can imply any number of Open ZRack configurations including the Double Open ZRack whose standard design has two (2) iCells mounted back to back FIG. 2(c) with a small amount of space in between them and has two (2) iCells side by side FIG. 1(a) adding up to 8 iCells per Double Open ZRack. A top view of the Double Open ZRack is schematically expressed as shown in FIG. 1(b); refers to the Double Open ZRack which allows for greater densities without compromising cooling or serviceability 100 comprising of 8 iCells. For illustrative purpose another version of the Open ZRack is used in FIG. 2 (a & b), this one of many possible variations of the Open ZRack.

More particularly, the Open ZRack/iCell(s) designs are a complete departure from the Standard 'U" rack design and traditional HPC cooling systems which draw cold air from the front of the HPCs' 'U' chassis then expel heated/hot air out the back. Some of the HPC vendors in this marketplace require empty "U"s in the rack to minimize the heat in the chassis, requiring additional racks to host their solution in addition to hot/cold Data Center isles that follow the Data Center's best practices. This requires additional Data Center space to accommodate the additional racks and both cold and hot Data Center Isles. The Standard 'U' chassis design not only requires more space, it is in many ways an energy inefficient design. From a heating, ventilation and air conditioning (HVAC) perspective, the Standard 'U' design creates a high degree of cold to hot air cross-contamination. This is due to the high-speed fans and exiting air vectors, which runs parallel to the Data Center floor, requiring more supporting equipment to address the much higher cooling and ventilation/power output requirements to effectively cool a plurality of HPCs. Hot air and cool air cross-contamination is an effect that is multiplied by the need to cool storage attached solutions (to the HPCs) with the majority of storage solutions also cooled in the same way as HPCs, also requiring sophisticated hot/cold air isles, in some cases requiring chillers and heat exchanger units, large redundant disaster recovery power generators/batteries and in many cases requiring hundreds of switches and routers coupled to miles of cabling to provide the needed network interconnects between large HPCs and Storage systems.

The present invention provides a way for Data Centers to dramatically reduce Data Center space utilization, significantly reducing power consumption and supporting equipment such as HVAC, converters, surge protectors, Demand Response Power Generators, batteries, switches, routers and cabling while also increasing application performance due to a more direct NVM (much lower power draw then spinning disk yet at least 10,000 times faster) connection to the CPU via the Raptor 'Vx' cards, providing dynamic scalability via the iCells' integrated InfiniBand/backplane and to the CMIB backbone illustrated in FIG. 7.

This 32.88-107.52 Petabyte/120,960-322,560 core architecture requires only 2-3 external switches for redundancy & scaling, as opposed to hundreds of switches and routers commonly found in today's Data Center architectures to host comparable storage/core footprints. Use of the CMIB's scalability and InfiniBand protocol/remote direct memory access (RDMA) as opposed to Ethernet protocol further reduces power consumption and latency by leveraging each iCell's InfiniBand backplane to interconnect individual Raptor 'Vx' cards and thereby dramatically reducing the CPU's workload. This approach provides more computing power with the same amount of cores and exponentially reduces CPU power requirements at normal operating loads which would otherwise require much higher power/CPU loads, increasing latency if leveraging non-RDMA interconnects.

In one embodiment, the iCell is pivotally mounted to the Open ZRack which itself is mounted to the Data Center floor to enable the Open ZRack to be pivoted horizontally manually or automatically which provides easier iCell access and serviceability in tight spaces.

In another embodiment, a plurality of iCells are pivotable from their vertical position of 90 degrees and able to lock at the desired operating angle, 68-82 degrees' pivot angle, left or right via the Open ZRack's manual or automatic cam locking mechanism (Open ZRack vs. the automated version will lock in place and also adjust for optimal cooling). In such embodiment a preferable cooling path is formed between multiple iCells. When the plurality of iCells are locked within their optimum operational pivot angles, the exhaust gases of the lower iCells does not affect the cooling intake path of the iCells directly above FIG. 2(b & c).

In yet another embodiment, each iCell further comprises of at least one intake fan positioned at the bottom of the iCell (based on operating mode orientation illustrated in FIG. 2(b)) to pull in cool air from the Data Center floor, bringing this chilled air flow in an ascending pattern across each Raptor 'Vx' card for optimal cooling, and, with at least one outlet fan positioned above the iCell to extract air from above the plurality of the Raptor 'Vx' cards. In such embodiment, at least one outlet fan extracts air from above the plurality of the Raptor 'Vx' cards hosted within the iCells which are directed at a semi-vertical angle, bearing left or right of 90 degrees (Vertical position) at 68-82 degrees so that each iCell's respective operational modes directs hot air into the catch fans' designated areas of the Data Center ceiling's house fans to reclaim the hot air and/or to repurpose the hot air such as to form office space heating.

In another embodiment, each iCell further comprises of a hot-swappable, rail mounted electrostatic filter(s) powered via the backplane. The electrostatic filter(s) is/are located at the bottom/intake end of the iCells to minimize dust contamination buildup to internal components due to static electricity.

In yet another embodiment, the system further comprises of at least one mezzanine switch coupled to the plurality of Raptor 'Vx' cards, each mezzanine switch comprising of multiple ports for communication via the backplane. In such embodiment, the multiple ports are preferably switched via InfiniBand ports supporting enhanced data rate Enhanced Data Rate (EDR, 100 Gb/s), High Data Rate (HDR, 200 Gb/s), or even Next Data Rate (NDR). The use of the InfiniBand protocol/Remote Direct Memory Access (RDMA) as opposed to Ethernet protocol further reduces power consumption by significantly reducing the CPU workload hence providing more computing power with the same amount of cores and at a reduced power consumption level.

In another embodiment, the system further comprises of at least one K/VM (Keyboard and virtual mouse) I/O slot to host keyboard, mouse, management interfaces (local or remote is optional) or traditional Ethernet for K/VM.

In still yet another embodiment, each Raptor 'Vx' cards comprises of multiple sockets, each hosting multi-processor cores coupled to multiple Data Direction Register (DDRx) slots.

In another embodiment, integrated within the bottom right and left of the iCell is a plurality of mezzanine cards to host hot-swappable graphics processor units (GPUs) coupled to the backplane, additional GPU slots may be added.

In accordance with still yet another embodiment of the invention, the system comprises of the Open ZRack, which is the hosting frame for the iCells, supporting each iCell via a pivot manual or automatic cam mechanism deployed on the Open ZRack's frame. In a typical setting, each iCell may comprise, by way of example, a total of up to twenty-one (21) but not less than two (2) Raptor 'Vx' cards, stacked 3 high-via 3 rows, each comprising up to seven (7) Raptor 'Vx' cards. The iCell is the Raptor 'Vx' card's hosting and cooling chassis with either an integrated high-bandwidth removable copper traced backplane or, with an optional serviceable optical backplane.

In one embodiment, the iCell hosts multiple Raptor 'Vx' cards with a rear I/O network mid-plane for InfiniBand (IB) interface. The network link bandwidth of the IB interface may support 4× links Single Data Rate (SDR, 8 Gb/s), Double Data Rate (DDR, 16 Gb/s), Quad Data Rate (QDR, 32 Gb/s), Fourteen Data Rate (FDR, 56 Gb/s), Enhanced Data Rate (EDR, 100 Gb/s), High Data Rate (HDR, 200 Gb/s), or even Next Data Rate (NDR). Various configurations may host a wide range of InfiniBand ports and lanes (e.g.: 1-64 ports with 1-24 lanes per port). Furthermore, the iCell may comprise additional rear plane K/VM (Keyboard and virtual mouse) I/O slots hosting Keyboard/Mouse, Management (local or remote is optional)) interfaces and traditional Ethernet for K/VM.

In some embodiments, the Raptor 'Vx' card, has the ability to host multiple sockets with each card capable of hosting a GPU (graphics processor unit) and multiple (e.g.: 16-64-x) DDRx (Data Direction Register) slots. Based on current Raptor 'Vx' card design and with the use of a copper traced backplane 16 DDRx slots may host up to 2 TB of RAM per card or 1 TB of RAM and 8+TB via remaining DIMM (dual in-line memory module) slots to host NVM such as Intel 3D XPoint™, or other NVM solutions which are subject to density increases as is RAM based on technological advances.

In one embodiment, all components of the iCell except for the backplane are hot swappable. The backplane requires powering off of the target iCell, removal of the cards, and the iCell is then serviceable via a rail system, coupled with the Open ZRack manual or automatic pivot mechanism this enables quick service turn-around times.

In some embodiments, the iCell is a scalable module, which may be scaled to hundreds or thousands of units within a single Data Center, with configurable core (CPU) density and storage capacity depending on end-user requirements. The Open ZRack is referred as such because it is descriptive where the 'Z' shape which is clearly identifiable when looking at the rack from the side and 'Open' because personnel can walk between multiple iCells/Open ZRack configurations.

This racking solution deemed the Open ZRack provides a manual or automatic interlocking cam mechanism to allow the iCells to be pivoted either manually or automatically to reach the optimal operating angled configuration, which, facilitates free flow of directed air cooling and thereby allows for increased density over conventional 'U' rack systems. The bottom/inlet of the stack chassis is oriented towards the Data Center floor's pressurized cold air induction system. Taking advantage of this standard Data Center design, the iCell(s) utilizes high flow fans to pull in the cold air from the bottom and forces the air through the iCell chassis to allow hot air to escape from the top of the chassis at an optimal operational angle of 68-82 degrees (Automated system via heat sensors establishes the optimal angle adjusting at pre-set intervals), most preferably 76 degrees for the Double Open ZRack/iCell configuration in the large Data Center. In some embodiments, additional high flow fans are disposed on the topside of the iCell(s) to aide warm air extraction. The Open ZRack may be configured to mount a single iCell with a single Raptor 'Vx' card or multiple iCells with multiple Raptor 'Vx' cards.

In some embodiments, the Open ZRack may be configured to host, for example, 36 or 40 iCells clusters and allow the hyperconverged ecosystem to dynamically scale within and/or across Data Centers in various configurations of storage or cores to accommodate the customer demands. Any number or configuration arrangement of Open ZRacks and iCells may exist within a cluster or within a Data Center environment, sometimes spanning across Data Center halls or across multiple Data Centers.

The present invention also provides a method for computer stacking and cooling, comprising mounting a plurality of pivotable iCells to at least one (1) Open ZRack, each iCells comprising of a plurality of Raptor 'Vx' cards; mounting at least one iCell in an Open ZRack; and providing cooling air flow from pressured cool air beneath the iCell. With a plurality of iCells being pivotally locked at the desired angle to form at least one exhaust path directed upwards into the Data Center's warm air catch fans, all without impeding on the cool air intake of iCells which sit higher in the Open ZRack; this is in contrast to the standard 'U' rack whose upper units are more subject to heat from bottom units.

In one embodiment the pressurized cool air is provided via the porous tiles in the Data Center floor, or via a cut-out wherein the iCell inlet is pointed towards the porous tile or directed towards the floor's cut-out to allow the pressured cool air flow in an upward path directed into the iCell and along at least one cooling path. A flexible inlet may be connected to the iCell, which enhances each iCells' ability to gain greater cooling efficiencies.

In another embodiment, at least one intake fan is disposed at the bottom of the iCell to pull in air for cooling purposes, and/or at least one outlet fan is disposed above at least one iCell to extract air from above the plurality of the Raptor 'Vx' cards. In such an embodiment, at least one outlet fan preferably, multiple fans extract air from above the plurality of iCells at a semi-vertical operating angle of 68-82 degrees.

In one embodiment the plurality of iCells are pivotable either manually, or automatically (Open ZRack 'Vx' rotates automatically via heat sensors to establish the optimal angle, adjusting every at preset intervals) according to the Raptor 'Vx' cards' and other internal temperatures readings.

In another embodiment, an electrostatic filter is disposed at the bottom of the iCell to minimize dust contamination buildup due to static electricity. Multiple filters may be used to offer continuous filtration redundancy during hot-swap filter replacement at the bottom of the iCell(s).

In another embodiment the cabling connectivity is depicted running from the iCells down to the Open ZRack frame and onto the Data Center floor.

In still yet another embodiment, the Open ZRack is pivotally mounted on the floor, enabling left or right rotation, locking in place via cam lock mechanism to enable ease of servicing.

In another embodiment, a locking mechanism attached to Data Center floor cut-out that locks a flexible air duct which runs the chilled Data Center airflow upwards to the bottom of an iCell's air intake as a method to increase cooling efficiency. This's cool air intake mechanism may be connected to a plurality of iCells, with multiple hoses connecting to a plurality of iCells' intake fans.

BRIEF DESCRIPTION OF DRAWINGS

References will be made to exemplary embodiments of the present invention that are illustrated in the accompanying figures. Those figures are intended to be illustrative, rather than limiting. Although the present invention is generally described in the context of those embodiments, it is not intended by so doing to limit the scope of the present invention to the particular features of the embodiments depicted and described.

FIG. 2(a, b, c & d) illustrate iCells mounted on an Open ZRack, in a vertical position and a pivoted manually or automatically in its operational position with an embodiment of the present invention. A flexible flap 141, which makes an air-tight seal to prevent hot/cold air cross-contamination between the bottom mounted and top mounted iCells.

FIG. 3(a) illustrates a front view angle of an iCell, which shows plurality of the Raptor 'Vx' cards and other sub-components such as power supplies and fans.

FIG. 3(b) shows the back view of the iCell, showing K/VM ports and interconnect and/or InfiniBand Mezzanine Switches.

FIG. 3(c) shows an illustrative side view of a Double Open ZRack comprising of 8 iCells per Open ZRack to provide a high density solution for the large Data Center space.

FIG. 4 is an illustration of an exploded view of a Raptor 'Vx' card with an embodiment of the present invention.

Various implementations and embodiments may be practiced in line with various specifications. All of these implementations and embodiments are intended to be included within the scope of the invention.

DETAILED DESCRIPTION OF THE PREFERRED EMBODIMENTS

In the following description, for the purpose of explanation, specific details are set forth in order to provide an added understanding of the present invention. The present invention may, however, be practiced without, some, or all of these details. The embodiments of the present invention described below may be incorporated into a number of different means, components, circuits, devices, and systems. Structures and devices shown in block diagram are illustrative of exemplary embodiments of the present invention. Connections between the components within the figures are not intended to be limited to direct connections. Instead, connections between components may be modified, re-formatted via intermediary components. When the specification makes reference to "one embodiment" or to "an embodiment", it is intended to mean that a particular feature, structure, characteristic, or function described in connection with the embodiment being discussed is included in at least one contemplated embodiment of the present invention. Thus, the appearance of the phrase, "in one embodiment," in different places in the specification does not constitute a plurality of references to a single embodiment of the present invention.

Various embodiments of the invention are used for a board integrated HPC/storage stack hyperconverged ecosystem. The system comprises of an adjustable Open ZRack system with a pivot mechanism supporting multiple iCells hosting multiple Raptor 'Vx' cards. The iCells make up the Raptor 'Vx' cards' cooling chassis and hosting mechanism, which may include an integrated high-bandwidth removable copper traced backplane or an optional serviceable optical backplane.

Figure 1A:
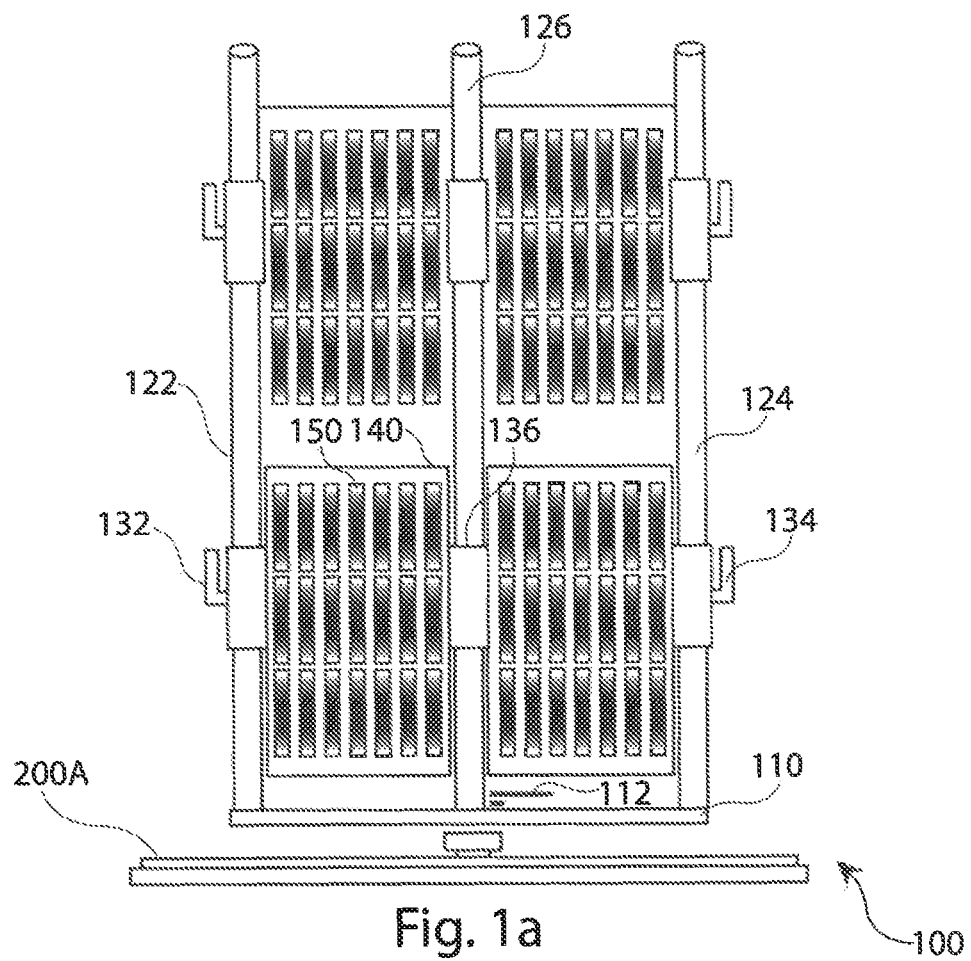
FIG. 1(a & b) illustrate a HPC stack with a board integrated storage system comprising of a Double Open ZRack with iCells stacked two high, with each iCell hosting a plurality of Raptor 'Vx' cards in accordance with an embodiment of the present invention.
Figure 1B:
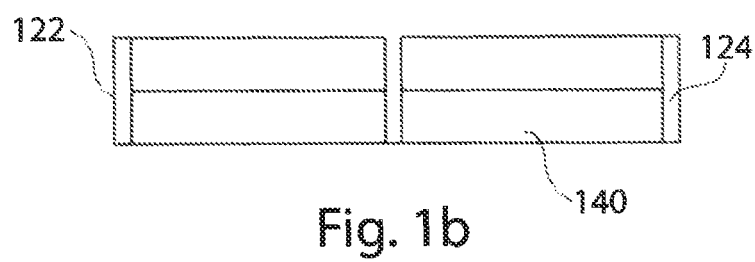
Figure 2C:
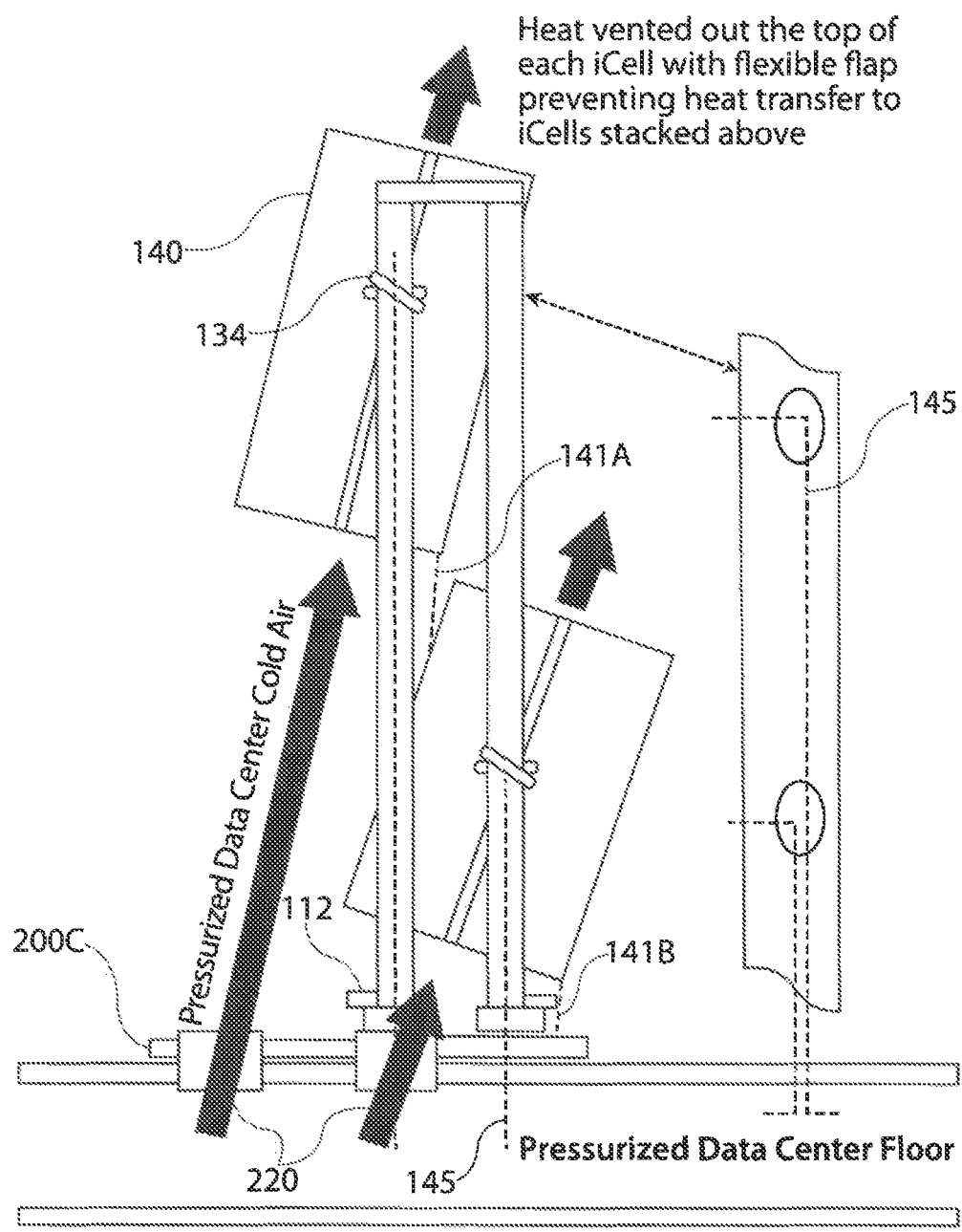
FIG. 2(c) illustrates the cabling connectivity running from the top of iCells down to the Open ZRack frame into a cable chase-way, which leads into the Data Center floor.

FIG. 1(a & b) illustrate a Double Open ZRack and iCells' system 100 comprising of 2 high iCells, each hosting a plurality of Raptor 'Vx' cards in accordance with an embodiment of the present invention. FIG. 1(a) shows a front view and FIG. 1(b) shows a top view. At least one iCell is mounted on the Open ZRack and extends upwards to mount multiple iCells 140. As shown in FIG. 1(a), a first Open ZRack vertical frame 122, a second Open ZRack vertical frame 124 and a third Open ZRack Vertical frame 126 are mounted on the Open ZRack bottom horizontal frame 110. Each Open ZRack may be hollow, in part, so that wiring 145 may easily be routed, and also allow for future cabling, and each comprises of at least one manual or automatic locking cam mechanism release handle (132, 134 and 136). As shown in FIG. 2(c), the cabling 145 is depicted running from the top of the iCells down to the Open ZRack frame in the cabling chase-way, down into the Data Center floor. The Open ZRack's manual or automatic cam release handle is configured to pivotally adjust corresponding iCells, which allows the iCells to be easily adjusted and/or mounted/ unmounted from the Open ZRack. In some embodiments, the Open ZRack cam may comprise of a manual or automatic locking cam mechanism to lock the iCell to a pivot angle for service or to a more desired cooling/operational position. The Open ZRack may be configured to host one or multiple layers of iCells. For example, two layers of iCells are arranged back to back as shown in FIG. 1(b) and in FIG. 2(c). The two layers may be pivoted manually or automatically in tandem with one Open ZRack locking cam mechanism release handle or independently with two separate Open ZRack manual or automatic locking cam mechanism release handles. The Open ZRack cam release handles may be pivoted manually or automatically via a motor. The motor may couple to a temperature sensor disposed on or in approximate to a corresponding iCells and be configured to pivot the iCells to a desired pivot angle according to the actual iCells internal temperature sensors, or to the Raptor 'Vx' card temperature sensors.

In some embodiments, FIG. 1(b) and in FIG. 2(c) the Double Open ZRack's bottom horizontal frame 110 is pivotally mounted on a base plate 200A, 200B or 200C such that the bottom horizontal frame 110 may be pivoted/rotated via a chassis manual or automatic locking cam mechanism release handle 112. Such an arrangement provides enhanced flexibility and serviceability for the iCell's subcomponents 100.

The iCell is a modular unit hosting a plurality of Raptor 'Vx' cards. In one exemplary setting shown in FIG. 1(a), each iCell 140 may comprise a total of 21 Raptor 'Vx' cards arranging the compute/NVM storage via 7 Raptor 'Vx' cards stacked 3 high.

In some embodiments, each iCells 140 disposed on the Open ZRack comprises of an electrostatic filter at the bottom of the iCells which slides on two rail slots, one filter occupies a slot to minimize dust contamination buildup due to static electricity, minimizing the chances of internal critical component hot spots due to dust, such as on the CPU or any other electronic component within the iCells. The remaining filter slot is for service use to insert a new filter under operational conditions without exposing to potential contaminants or risk.

Although FIG. 1(a & b) are shown with the exemplary component structure for a board integrated HPC/storage stack hyperconverged ecosystem 100, it is understood that various modification may be applied. The modification may be made by including additional components, or by integrating various components into a single component. For example, more iCells may be installed on the Open ZRack with increased height and width and/or via more cam pivots and manual or automatic release handles to host more iCells/Raptor 'Vx' cards in various plurality configurations.

FIG. 2(a, b & c) illustrate iCells mounted on a Open ZRack in a vertical position and can be pivoted manually or automatically in position with an embodiment of the present invention. In FIG. 2(a), the iCell(s) are all aligned in the vertical position.

In FIG. 2(c), the iCells are pivoted manually or automatically to a desired operational position (76° is optional for airflow and cooling). It is important to note that a spring loaded (or automatically adjustable) flexible flap 141A is located on the bottom of the top-mounted iCell 140 and hangs down under the top-mounted iCell, making a seal between its lower iCell neighbor to prevent cross-air contamination of the bottom iCell's air exhaust and that of the top iCell cold air intake stemming from the Data Center floor. Cool air intake for the top mounted iCell therefore remains unhampered. Similarly, the bottom iCell's flap 141B makes the seal with the Open ZRack base 200C to provide an optimized cold air intake path into the iCell from the Data Center floor. Each iCell may or may not have the same pivot angle. In FIG. 2 (a & c) The Open ZRack cam release handles 132 may be pivoted manually or automatically via a motor. The motor may couple to a temperature sensor disposed on or in approximate to corresponding iCells and be configured to pivot the iCells to a desired pivot angle according to the actual iCells' temperature sensors or to the Raptor 'Vx' card temperature sensors, or to other sensors inputs monitoring other internal components.

Some traditional HPC stack systems in the standard 'U' form factor are configured by stacking multiple vertical units (Us) which draw cool air from a cool-air aisle, pulling this chilled air from the aisle via the front of the 'U' chassis and expelling the heated gases out to the back of the 'U' chassis creating a hot aisle. Hot air could get trapped in various parts of the compute platform, causing hot spots, a phenomenon further exacerbated by spinning disk which can be found in some HPC/storage designs, which creates more heat and airflow restrictions while consuming much more energy then NVM. Furthermore, in the standard 'U' HPC and/or storage designs, the bottom units may heat up the units above within the same rack. This inherent standard 'U' design also creates a need for hot air aisles in the Data Center behind the chassis as the standard means to evacuate hot air via high speed fans, blowing of hot gases out the back, which requires more Data Center space and energy. These hot air aisles are intended to give the exiting air from the chassis time to rise into the Data Center ceilings where this hot air can then be reprocessed in a return system, vented off, or used for office space heating. As previously mentioned, cool-air aisles must also be used to provide adequate cool air intake to the HPCs, thus further elevating Data Center space requirements. Unavoidably, some heat transfer takes place between the cool air and hot air aisles via convection from high speed fans which direct the air in an horizontal vector (as opposed to vertical vector into the catch fans in the Data Center ceilings which is one of the Open ZRack/iCell design), all of which require more work, and therefore more energy input into the HVAC work load to overcome this standard 'U' design's inherent inefficiency. Additionally, another causal factor which contributes to the 'U' design's ineffectiveness also stems from convection and thermal heat transfers through the internals of 'U' chassis itself: the higher in the rack the compute nodes operate, the more susceptible these nodes are to heat transfer from the nodes below and, as heat rises, the higher the inlet temperature as you get higher within the 'U' chassis.

One advantage of the Open ZRack mounting system is that it allows each iCell to tilt into an operating angle in such a way that the top and bottom iCell both have a cool and hot air free flow or directed air path facilitated by both the operating angle and the flexible flap FIG. 2(b & c) 141A, 141B which prevents hot and cold air cross-contamination, thereby cooling highly efficiently in comparison to a standard 'U' designs. In one embodiment, a cooling airflow is provided from the Data Center pressurized cool air 220, which is distributed under Data Center floors as part of the Data Center standard infrastructure. The floor comprises at least one porous floor tile, or of a cut-out 210 to allow the cool Data Center air to pass through at an upward vector into the iCells' air intake. The ample space between the pivoted Raptor 'Vx' cards enables for a highly efficient and uniform cooling solution within each iCell.

Figure 2D:
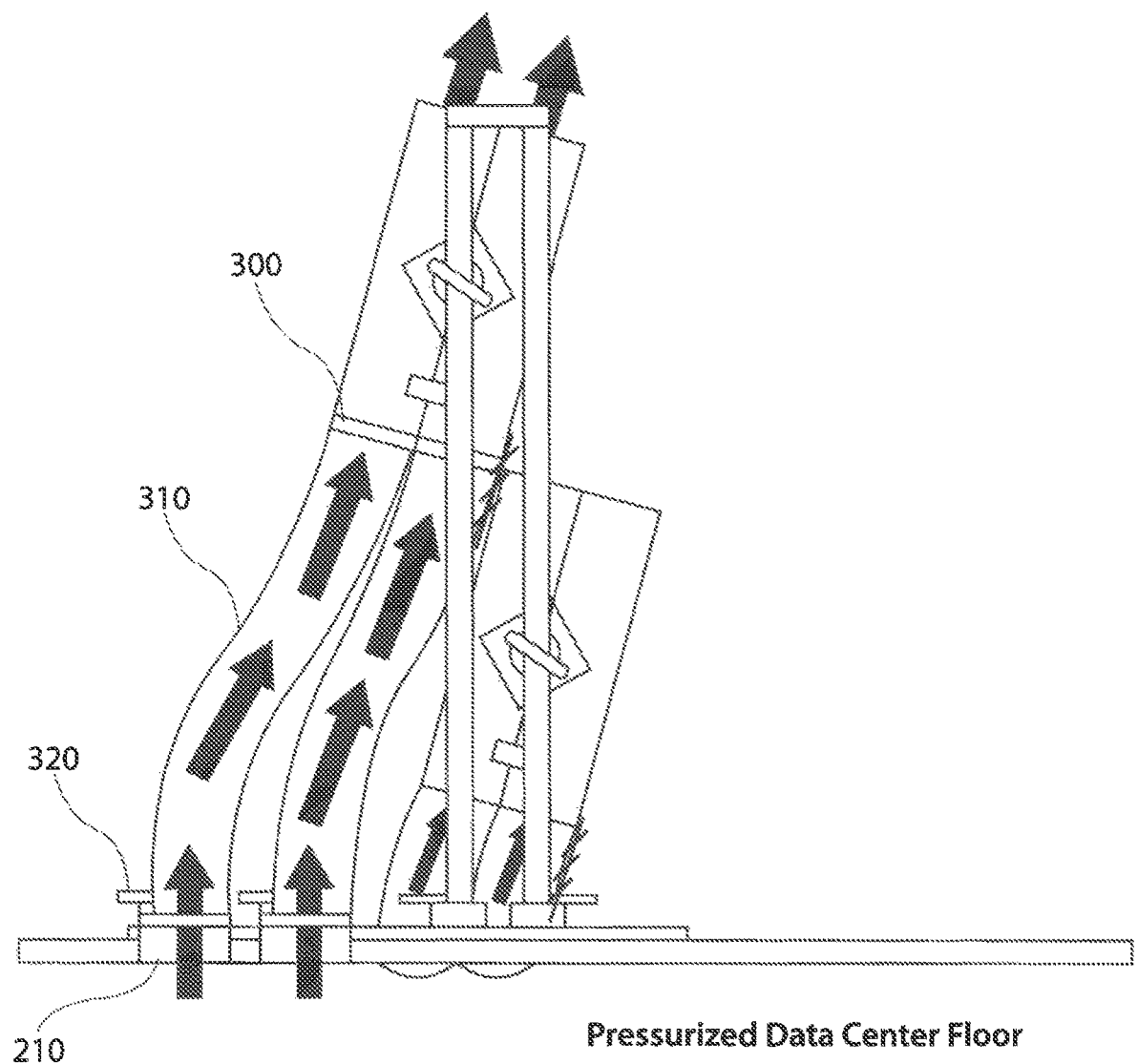
FIG. 2(d) illustrates an Open ZRack and iCell integrated HPC and Storage system with an optional cooling mechanism which channels chilled Data Center airflow via a Data Center floor cut-out and hose locking mechanism directing the chilled air in an upward pathway via a hose/flexible air duct attaching to the iCell(s) via front bezel connector as a method to increase cooling efficiency. This cool air intake mechanism may be connected to a plurality of iCells, with multiple hoses connecting to a plurality of iCells' intake fans.

Alternatively, as illustrated in FIG. 2(d), the chilled data center air flow may be delivered via flexible cold air ducts 310 which are fitted at their proximal end to cut outs 210 via a locking mechanism 320, and fitted at their distal ends to bezel connectors 300 at the bottom of the iCells. With such arrangement, flaps 141A, 141B may be eliminated.

Another advantage of the manual or automatic pivoted iCell(s) configuration is the relative surface area of the copper traced backplane which allows for the mass production of what is essentially just a large circuit-board via copper tracing. The iCell's InfiniBand (or other interconnect technology) backplane is one of the same for both the HPC and NVM storage components of the Raptor 'Vx' card hosted within the iCell, sharing that bandwidth reduces power consumption in this way by negating the need to power multiple backplanes (HPC & Storage). Such design also negates the need for additional switch requirements to link all of the HPCs to storage attached arrays found in other traditional IT architectures. Additionally, carrying NVM directly on the Raptor 'Vx' card means no moving parts such as disks which would create further power and heat inefficiencies: as the disks spins and spins to look for data at rest (not in-memory), the CPU is waiting, yet capable of processing information at least a 10,000 times faster than disk is capable of retrieving. Conversely the use of NVM on the board is at least a 1000 thousand times faster then the fastest spinning disks, (even if the disk is located on the board) and about 10 to 150 times faster then storage attached NAND (an outreach of 100 meters increases latency by about 500 nanoseconds, this important because if latency is cut in half throughput is conversely doubled) making the embodiment of the Raptor 'Vx' card and associated software all the more energy efficient by allowing the CPU to access and process information retrieved much more quickly on the Raptor 'Vx' card and without loading the CPU via remote direct memory access (RDMA)/InfiniBand when connecting with a another node or with a plurality of nodes.

FIG. 3(a, b & c) illustrate various view angles of an iCell and storage system in accordance with an embodiment of the present invention. FIG. 3(a) is a front view of the system. FIG. 3(b) shows a back view and FIG. 3(c) shows a side view. For this illustration, the Open ZRack and the iCell chassis are not show shown in FIG. 3 to better describe the internal components. Although only one iCell is shown in FIG. 3, it is understood that the Open ZRack and iCells may be configured in multiple arrangements/configurations.

In FIG. 3(a) at least one intake fan 160 is disposed below the iCell pulling cold air through a cut-out of the Data Center floor or via the porous floor tiles 210 this intake fan actively pulls in the pressurized cool air FIG. 2(b) 220 from the bottom through filter 142 and forces that cool air through the iCell FIG. 3(a) 140, for the iCell which sits above the bottom unit on the Open ZRack draws the Data Center air via much of the same mechanism as illustrated in FIG. 2(b) 240. In some embodiments, additional outlet fans (see FIG. 5 170) may be disposed on the top the iCell to aide warmed air extraction from the topside. In a preferred configuration, the warmed air is extracted out the top of the iCell at an angle of 68-82 degrees (Open ZRack 'Vx' automatically adjusts via heat sensors to establish the optimal angle adjusting at preset intervals). In some embodiments, the intake fan FIG. 3(a) 160 and outlet fan 170 are high flow fans powered by hot-swappable power supplies. In some circumstances, the extracted warm air may be recuperated to heat office spaces for energy savings.

Figure 5:
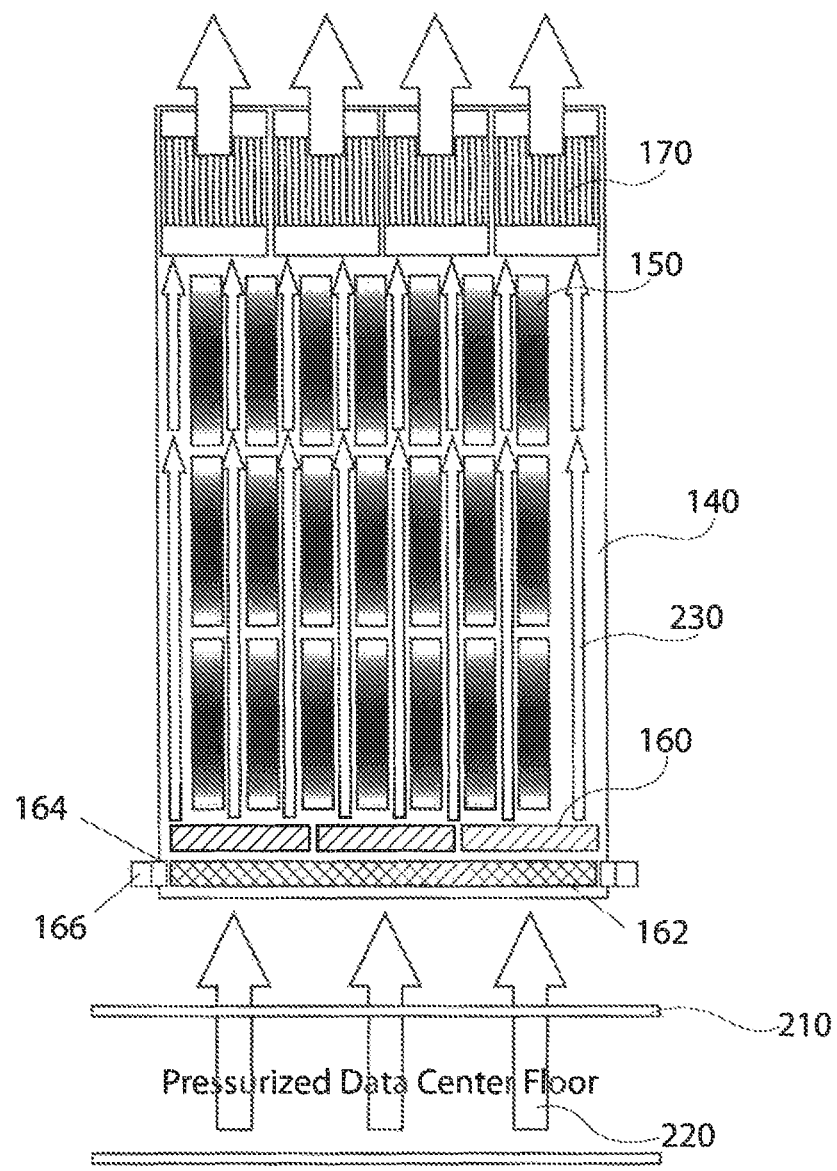
FIG. 5 is an illustration of internal airflow cooling the Raptor 'Vx' cards inside the iCell in accordance with an embodiment of the present invention.

In some embodiments, each iCell shown in FIG. 3(a) and FIG. 5 140 disposed on the stack chassis comprises of an electrostatic filter 142 which may be powered via the backplane using high voltage, low amperage to improve efficiency. This electrostatic filter is located at the bottom of the iCell, which slides via a double rail system to facilitate hot-swapping of filters to minimize dust contamination buildup due to static electricity in the iCell's internals.

FIG. 3(b) shows a back view of the iCell, containing at least one mezzanine InfiniBand (IB) switch 180 and additional rear plane K/VM (Keyboard and Virtual Mouse) I/O slots 190. The mezzanine InfiniBand (IB) switch 180 couples to the backplane and to each Raptor 'Vx' cards and may comprise of multiple ports, such as InfiniBand ports, for communication to other devices. The mezzanine InfiniBand (IB) switch 180 may be configured to support Single Data Rate (SDR, 2.5 Gb/s), Double Data Rate (DDR, 5 Gb/s), Quad Data Rate (QDR, 10 Gb/s), Fourteen Data Rate (FDR, 14 Gb/s), Enhanced Data Rate (EDR, 25 Gb/s), High Data Rate (HDR, 50 Gb/s), or even Next Data Rate (NDR). The K/VM I/O slots 190 are configured to host Keyboard/Mouse, Management interfaces and traditional Ethernet for K/VM.

In some embodiments, the iCell and storage system comprises of an integrated high-bandwidth removable copper traced InfiniBand backplane or an optional optical backplane. The copper traced backplane has a surface area large enough to provide the needed spacing for existing copper-tracing manufacturing techniques to support higher throughput bandwidth such as 100 Gbps EDR, HDR InfiniBand and without crosstalk.

Many manufacturers use copper tracing techniques to mass produce backplanes and to find the needed space to accommodate proper spacing to prevent/minimize crosstalk, these designs are currently limited to 7 U to 10 U designs to allow for the needed surface area and are limited to the use of FDR InfiniBand at 56 Gbps which is less susceptible to crosstalk than that of 100 Gbps EDR. EDR not only increases bandwidth between nodes but also cuts down the round trip outreach between nodes by about 140 nanoseconds (300 nanoseconds for FDR V.S. 100-160 nanoseconds with EDR, thereby significantly increasing the data stream to the CPU which goes through a clock cycle approximately every 0.3 nanosecond, waiting for data most of the time, EDR increases aggregate compute/storage efficiency over FDR). Copper tracing techniques are well known and manufacturing suppliers are abundant, thereby reducing production cost but also reducing time to market in providing an advanced EDR and/or HDR solution using the HPC cells disclosed in the invention.

In some embodiments, the iCells' compute and storage ecosystem comprises of a detachable optical backplane as an alternative to a copper traced backplane. The optical backplane provides greater chassis life and reduces power requirements. Furthermore, the optical backplane eliminates any crosstalk concerns that incur with higher throughput interconnections (node to node over short distances, e.g. less than 2 km) allowing for seamless upgrades when higher bandwidth becomes commercialized.
The utilization of an optical backplane increases iCell core, RAM and NVM density by 50+% using the same generation chips, RAM, and NVM technologies. An iCell with an optical backplane allows for upgrades to mezzanine cards, network and GPU in addition and next generation CPUs, Ram and NVM reutilizing the iCells and backplane, allowing significant cost savings and future-proof.

The optical backplane may conjointly facilitate the above mentioned optical interconnect upgrade on the Raptor 'Vx' card as well as with the iCell's integrated switching mechanism to higher bandwidth, such as the next generation 200 Gbps InfiniBand interconnects, whose bandwidth may be impractical for copper tracing. The whole lifespan of the iCell ecosystem is thereby increased via these upgradability features.

In some embodiments, the iCell has a rear I/O network mid-plane for InfiniBand (IB) interface to host the compute cards. The network link bandwidth of the IB interface may support Single Data Rate (SDR, 2.5 Gb/s), Double Data Rate (DDR, 5 Gb/s), Quad Data Rate (QDR, 10 Gb/s), Fourteen Data Rate (FDR, 14 Gb/s), Enhanced Data Rate (EDR, 25 Gb/s), High Data Rate (HDR, 50 Gb/s), or even Next Data Rate (NDR). Configurations may be configured to host 16-64 total switched IB ports. Furthermore, the iCells may comprise of additional rear plane K/VM (Keyboard and virtual mouse) I/O slots hosting Keyboard/Mouse, Management interfaces and traditional Ethernet for K/VM.

FIG. 4 is an illustration of an exploded view of a compute card 150 with an embodiment of the present invention. The Raptor 'Vx' card, has the ability to host multiple processors 152 with each processor coupling to a GPU 200 (graphics processor unit) and multiple DDRx (Data Direction Registers—such as eight per socket but not limited to eight) slots 156. The DDRx slots may host up to 2 TB of RAM or 1 TB RAM and 8 TB of Non Volatile Memory such as Intel 3D Xpoint™ via DIMMs (dual in-line memory modules) slots to provide NVM storage memory directly connected to the CPU. Such NVM memory, Intel 3D Xpoint™ and/or other proprietary technologies are expected to increase in density and performance in the near future. In some embodiments, the compute card comprises Storage defined software (SDS) to define RAM/Storage on demand.

In some embodiments, a Raptor 'Vx' compute card may be configured to host Intel's latest XEON CPU with 16 DDR DIMM slots, hosting DDR4 or DDRX memory and/or Intel's Intel 3D Xpoint™ NVM. This Raptor 'Vx' compute card differs from some current available solutions in several key areas. For example, the HP Moonshot solution is only capable of hosting lower powered Intel CPU's and in-memory capabilities. The Moonshot has onboard spinning disk, which further limits its abilities to keep up with CPU capabilities which are orders of magnitude faster than the fastest spinning disk solutions. HP BL460C Gen 9 is the latest blade design from HP with the ability to support the latest Intel chip (36-core) but with limited ability to support 1 Terabyte of the latest DDR4 memory and at the time of this writing, no ability to support Intel 3D Xpoint™/NVM in the DIMM slots. Should such an HPC design make the necessary hardware and software changes to integrate higher RAM and NVM in the DIMM slots, the iCell configuration illustrated in FIG. 6(b) shows about a 10× density advantage over the HP BL460C solution illustrated in FIG. 6(a).

In one embodiment, illustrated in FIG. 5, the components of the iCell 140 hosts both the HPC and storage solution via the Raptor 'Vx' card 150, sliding in and out via rail guided mechanism or by other means to provide hot-swapability, rail 164 mounted, electrostatic filters 162, powered by a backplane 166 within the given iCell. Intake fans 160 and outlet fans 170, are also hot-swappable. Such an iCell configuration mounted on the Open ZRack increases the serviceability of the board integrated HPC/storage stack hyperconverged ecosystem.

FIG. 5 is an illustration of internal airflow cooling the iCell and all its internal components in accordance with an embodiment of the present invention. Intake fans 160 disposed above the porous floor tile 210 or floor cut-out actively pull in the pressured cool air 220 from the bottom and force that cool air through the iCell 140. The Open ZRack/iCell ecosystem takes advantage of cold air naturally found at the bottom of the Data Center floor and via the air's path through the iCell takes advantage of the thermal dynamics of any Data Center's floor spaces with the heated air rising in an upward vector where it would be collected in the Data Center Ceiling. The outlet fans 170 disposed on the top the iCell also function to extract warm air from the topside. Although the cool air flow 220 illustrated in FIG. 5 are vertical to the floor, it is understood that the cool air flow 220 may be manipulated via the Open ZRack's pivot angle mechanism, by pivoting the iCell 140, adjusting the intake's fan angle relative to the Data Center floor, and correspondingly adjusting the outlet fan extracting angle and congruently exhaust air flow angle (as a single plane for all of the iCell's components). A manual or automatic pivoted cooling airflow 230 would be more efficient in cooling the multiple iCells as explained in FIG. 2(b). In a preferred configuration, the warm air is extracted out the top of the iCell at an angle of 68-82 degrees Open ZRack 'Vx' automatically via heat sensors may establish the optimal angle adjusting at set time intervals.

FIG. 2(d) illustrates an Open ZRack and iCell integrated HPC and Storage system with an optional cooling mechanism which channels chilled Data Center airflow via a Data Center floor cut-out 210 and hose locking mechanism 320 directing the chilled air in an upward pathway via a hose/flexible air duct 310 attaching to the iCell(s) via front bezel connector 300 as a method to increase cooling efficiency. This cool air intake mechanism may be connected to a plurality of iCells, with multiple hoses connecting to a plurality of iCells' intake fans.

Figure 6A:
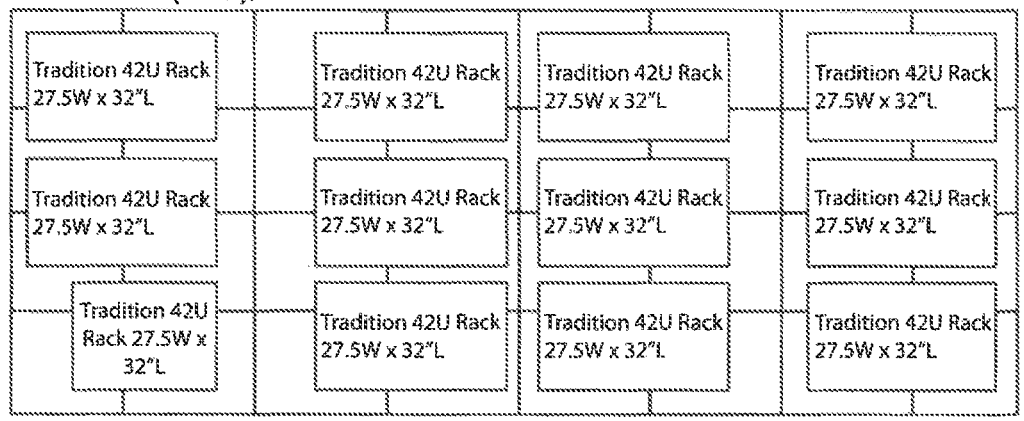
FIG. 6(a & b) illustrate other HPC and storage solutions which would be needed to match core, RAM and storage capacity compared to the featured Double Open ZRack and iCell HPC/NVM storage ecosystem illustrated in FIG. 6C.
Figure 6B:
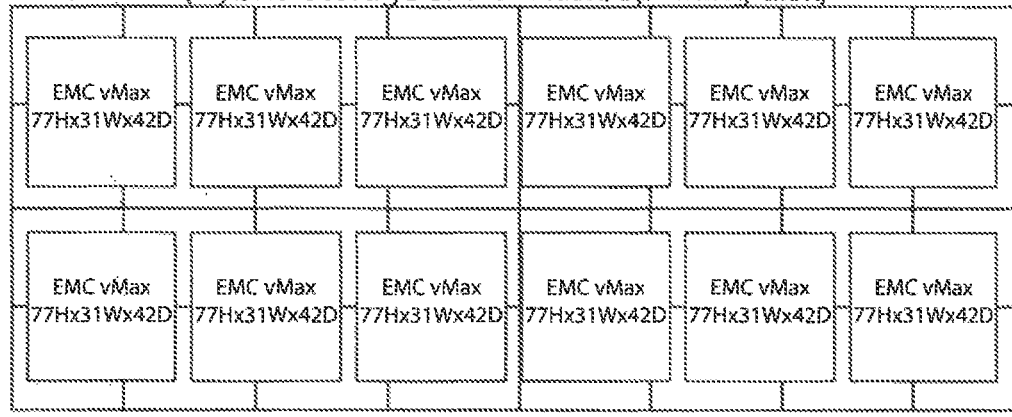
Figure 6C:
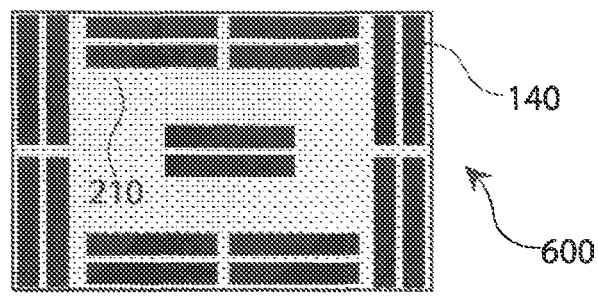

FIG. 6 (a, b & c) illustrate a baseline configuration comparison between the featured Open ZRack/iCell ecosystem and other solutions. FIG. 6(a) is a configuration of a Hewlett-Packard (HP) BL 7000 (10 U)/BL465C Gen 9 server blade. FIG. 6(b) is a configuration of an EMC VMAX hybrid Storage 6 PB of Flash/Spinning disk. FIG. 6(c) is a configuration of a HPC rack and storage system 600 with iCells 140. The Open ZRack/iCell ecosystem 600 occupies space of around 4 floor tiles with each tile measuring 2 feet by 2 feet square. Furthermore, the Open ZRack/iCell ecosystem 600 provides data at rest (so not stored in RAM) retrieval speeds which are much quicker, by at least an order of magnitude due to the use of NVM such as Intel 3D Xpoint™ on the Raptor 'Vx' card itself, in the sub-microsecond range while consuming less power than RAM, and much less then any form of attached storage demonstrated in FIG. 6(a & b) illustration.

Figure 7:
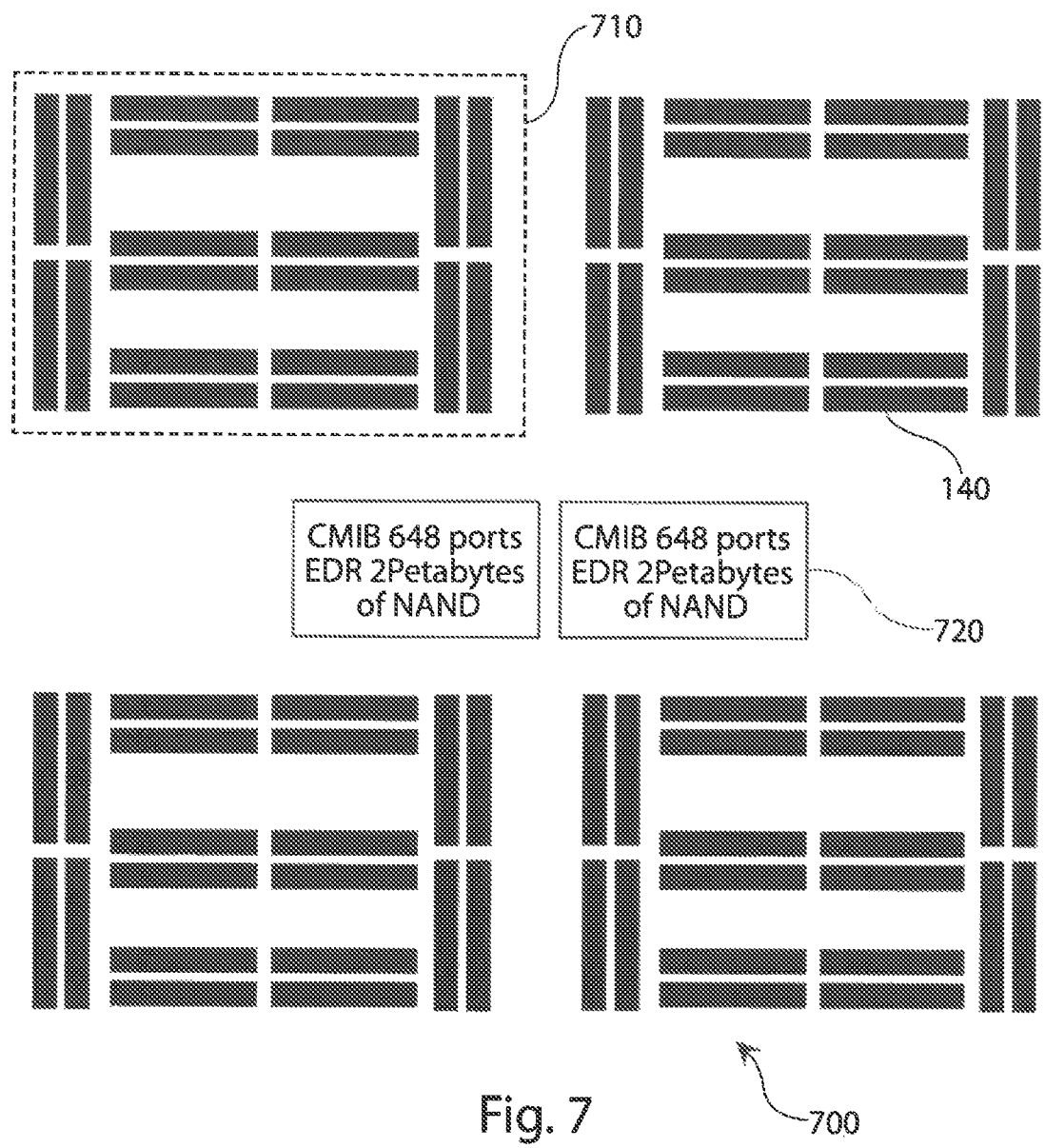
FIG. 7 is an illustration of an ultra large Data Center configuration using the Open ZRack/iCell's and Raptor 'Vx' card/software ecosystem and in accordance with an embodiment of the present invention, this is one of several configuration variants which includes 147,840+ CPU cores, 3.44 Petabytes of RAM, 219 Petabytes of Non Volatile Memory (limited to current NVM density which is expected to increase year to year) with two (2) Central Management InfiniBand Backplane (CMIB), each providing 130 Tbps of bandwidth, conjointly providing a huge reduction in Data Center space and power savings.

FIG. 7 is an illustration of an ultra large Data Center 700, 710 shows a plurality of the Double Open ZRack/iCell ecosystem in accordance with an embodiment of the present invention FIG. 2I. The exemplary configuration FIG. 7 comprises of 40 iCell X4 clusters 710 and two (2) Central Management InfiniBand Backbone (CMIB) 720. Each iCell clusters 710 are comprised from 40 iCells 100, each rectangle corresponding to two iCells as illustrated in FIG. 1(a & b) hosted on a Double Open ZRack FIG. 2I. In another variation, the ultra large Data Center iCell cluster has capacity of 3.44 Petabytes of DDR4 RAM, 26.88 Petabytes of Intel 3D Xpoint™ storage, 147,840 cores with over 32 Tbps EDR throughput to the CMIB (130 Tbps switching). Each CMIB may host NAND storage 720 as illustrated to provide additional storage capacity without relying on spinning disk.

A core to core comparison between FIG. 6(a, b), and FIG. 6(c), with the later illustration showing a 36 iCells configuration (Traditionally 40 iCells clusters would be used within the same Data Center footprint), which is completely self-contained within 112 square feet and while not shown in this comparison (for simplification purposes) would also include a walking Isle with 2-4 CMIBs, 720. Conversely FIG. 6(a & b) of traditional solutions from HP and EMC does not account for cool and hot air isles which would use additional Data Center space) to match core count, RAM, and attached storage which requires much more energy in power and cooling. When adhering to best Data Center practices accounting for cold and hot air aisles, the HP/EMC solution illustrated in FIG. 6(a & b) would require about 15,600 square feet and this square footage occupancy estimate does not include needed area for switching equipment.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

The invention claimed is:

1. A high performance computing (HPC) rack and storage system comprising:
   an open Z-shaped rack (Open ZRack);
   at least one integrated HPC/storage cell/chassis enclosure (iCell) mounted on the Open ZRack;
   a plurality of integrated/combined HPC and Storage cards hosted within the at least one iCell which is/are pivotally mounted to at least one Open ZRack which is configured to be used individually or in plurality for high performance computing, and
   one or a plurality of hot-swappable electrostatic filters located below the at least one iCell to minimize dust contamination buildup on the at least one iCell as cooling air flows upwardly past the at least one iCell.

2. The HPC rack and storage system of claim 1 wherein the Open ZRack is pivotally mounted on a floor to enable the at least one iCell and the Open ZRack to be pivoted.

3. The HPC rack and storage system of claim 1 wherein the at least one iCell are pivotable to a locked pivot angle via the Open ZRack comprising of a locking cam mechanism.

4. The HPC rack and storage system of claim 3 further comprising the at least one iCell comprises a plurality of iCells, a cooling air intake and hot air exhaust path which prevents heat transfer between the plurality of iCells that are mounted at a lower position on the Open ZRack and prevents heat transfer when the plurality of iCells are pivotably locked into an operational angle via the Open ZRack(s), wherein an operational angle of the plurality of iCells are manually or automatically adjustable.

5. The HPC rack and storage system of claim 4, further comprising a flexible flap installed on a top mounted iCells which forms an essentially air-tight seal to prevent hot/cold air cross-contamination between a bottom mounted iCells and the top mounted iCells which are attached to the Open ZRack.

6. The HPC rack and storage system of claim 4, further comprising a flexible flap installed on a bottom mounted iCells, said flexible flap serving to reduce cool air scattering and to create a more efficient cooled air flow into intake fans of the plurality of iCells.

7. The HPS rack and storage system of claim 6, where the flexible flap makes a seal with a base plate of the Open ZRack to provide a cold air intake path into the plurality of iCells from a Data Center floor.

8. The HPC rack and storage system of claim 4 further comprising at least one outlet fan to extract air from above the plurality of iCells at an operating angle between 68 and 82 degrees to the vertical.

9. The HPC rack and storage system of claim 1 further comprising at least one intake fan located near a bottom of the at least one iCell to pull in cooling air.

10. The HPC rack and storage system of claim 1 further comprising at least one outlet fan disposed on a top portion of the at least one iCell to extract warmed air from above the at least one iCell.

11. The HPC rack and storage system of claim 1, wherein the hot-swappable electrostatic filter(s) is/are rail mounted and powered via a backplane.

12. The HPC rack and storage system of claim 1 further comprising a locking mechanism attached to a Data Center floor cut-out that locks onto a flexible air duct which directs chilled Data Center airflow upwards to a bottom of an air intake of the at least one iCell via a bezel connector.

13. The HPC rack and storage system of claim 12, comprising a plurality of said flexible air ducts connecting to a plurality of intake fans.

14. The HPC rack and storage system of claim 1 further comprising at least one mezzanine switch coupled to the at least one iCell, each mezzanine switch comprising multiple ports for interconnects.

15. The HPC rack and storage system of claim 14, wherein the multiple ports are switched ports supporting enhanced data rate (EDR), high data rate (HDR) or next generation data rate (NDR).

16. The HPC rack and storage system of claim 1 wherein the system further comprises at least one Keyboard and virtual mouse K/VM I/O slot to host keyboard, mouse, management interfaces or traditional Ethernet for the K/VM.

17. The HPC rack and storage system of claim 1 wherein each one of the plurality of the Storage cards comprises multiple processors, wherein each processor couples to multiple Data Direction Register (DDRx) slots and to backplane graphics processor unit (GPU) slots which are easily accessible and hot-swappable.

18. A method for compute and storage stacking and cooling comprising:

providing a pivotable open Z-shaped rack (Open ZRack), configured to pivotably host a plurality of integrated high performance computing HPCS/storage cell/chassis enclosures (iCells);

mounting the plurality of iCells on the Open ZRack; and providing cooling air flow from pressured cool air through one or a plurality of hot-swappable electrostatic filters located beneath the Open ZRack to minimize dust contamination buildup on the plurality of iCells as cooling air flow upwardly past the plurality of iCells; the plurality of iCells being pivotable at a locked position to an operational angle to form at least one cooling path and at least one exhaust path along a single plane between pivotably mounted adjacent iCells.

19. The method of claim 18, wherein the plurality of iCells are pivotable to a locked position via a cam mechanism.

20. The method of claim 18 wherein pressured cool air is provided from beneath a porous tile or Data Center floor cut-out wherein the Open ZRack and the plurality of iCells are mounted on the porous tile to allow the pressurized cool to air flow upward and along at least one cooling path.

21. The method of claim 18 further comprising providing at least one intake fan below the plurality of iCells to pull in cooling air.

22. The method of claim 18 further comprising providing at least one outlet fan above the plurality of iCells to extract air from above the plurality of iCells.

23. The method of claim 22 wherein the at least one outlet fan extracts air from above the plurality of iCells at a vertical angle of 68-82 degrees.

24. The method of claim 18 wherein the plurality of iCells are pivotably, manually or automatically adjusted according to iCell temperatures.

25. The method of claim 18 further comprising using a rail system to slide in a new electrostatic filter and to slide out an old electrostatic filter without equipment shut-down.

26. The method of claim 18 further comprises pivotably mounting the Open ZRack on a floor.

* * * * *